(12) United States Patent
Wu et al.

(10) Patent No.: US 12,310,090 B2
(45) Date of Patent: May 20, 2025

(54) CMOS TOP SOURCE/DRAIN REGION DOPING AND EPITAXIAL GROWTH FOR A VERTICAL FIELD EFFECT TRANSISTOR

(71) Applicant: International Business Machines Corporation, Armonk, NY (US)

(72) Inventors: Heng Wu, Santa Clara, CA (US); Ruilong Xie, Niskayuna, NY (US); Su Chen Fan, Cohoes, NY (US); Jay William Strane, Warwick, NY (US); Hemanth Jagannathan, Niskayuna, NY (US)

(73) Assignee: International Business Machines Corporation, Armonk, NY (US)

( * ) Notice: Subject to any disclaimer, the term of this patent is extended or adjusted under 35 U.S.C. 154(b) by 22 days.

(21) Appl. No.: 18/093,932

(22) Filed: Jan. 6, 2023

(65) Prior Publication Data
US 2023/0154801 A1    May 18, 2023

Related U.S. Application Data

(62) Division of application No. 16/828,619, filed on Mar. 24, 2020, now Pat. No. 11,615,990.

(51) Int. Cl.
*H10D 84/01* (2025.01)
*H01L 21/265* (2006.01)
(Continued)

(52) U.S. Cl.
CPC ......... *H10D 84/017* (2025.01); *H01L 21/265* (2013.01); *H10D 30/63* (2025.01);
(Continued)

(58) Field of Classification Search
CPC ..... H01L 21/823487; H01L 21/823885; H01L 21/823814; H01L 29/0847; H01L 29/41741; H01L 29/66666; H01L 29/7827; H01L 21/265; H01L 21/266; H01L 21/823418; H01L 27/092; H01L 27/088; H01L 29/0653; H01L 29/167; H01L 29/6656; H10D 84/017; H10D 84/0195; H10D 84/038; H10D 84/01; H10D 84/016; H10D 84/013; H10D 84/85; H10D 84/8311; H10D 84/8312; H10D 84/83135; H10D 84/83138; H10D 84/8314; H10D 84/8316; H10D 84/851; H10D 84/852; H10D 30/63;
(Continued)

(56) References Cited

U.S. PATENT DOCUMENTS

| | | |
|---|---|---|
| 8,268,689 B2 | 9/2012 | Guo et al. |
| 9,299,835 B1 | 3/2016 | Anderson et al. |
| 9,443,982 B1 | 9/2016 | Balakrishnan et al. |
| 9,917,090 B1 * | 3/2018 | Cheng ............ H01L 21/823418 |

(Continued)

OTHER PUBLICATIONS

List of IBM Patents or Patent Applications Treated as Related.

*Primary Examiner* — Michael M Trinh
(74) *Attorney, Agent, or Firm* — Kimberly Zillig; Ryan, Mason & Lewis, LLP

(57) ABSTRACT

A method includes forming a p-type field effect transistor region and an n-type field effect transistor region into a semiconductor substrate. The method implements a process flow to fabricate highly doped top source/drains with minimal lithography and etching processes. The method permits the formation of VFETs with increased functionality and reduced scaling.

20 Claims, 8 Drawing Sheets

(51) Int. Cl.
*H10D 30/63* (2025.01)
*H10D 62/10* (2025.01)
*H10D 64/01* (2025.01)
*H10D 84/03* (2025.01)
*H10D 84/85* (2025.01)

(52) U.S. Cl.
CPC ......... *H10D 62/116* (2025.01); *H10D 64/021* (2025.01); *H10D 84/0195* (2025.01); *H10D 84/038* (2025.01); *H10D 84/85* (2025.01)

(58) Field of Classification Search
CPC .. H10D 30/025; H10D 62/116; H10D 62/834; H10D 62/83; H10D 62/151; H10D 84/83; H10D 84/832; H10D 84/833; H10D 84/835; H10D 84/836; H10D 84/837; H10D 84/839; H10D 64/252; H10D 64/2523; H10D 64/2527
See application file for complete search history.

(56) References Cited

U.S. PATENT DOCUMENTS

| | | | |
|---|---|---|---|
| 9,929,246 | B1 | 3/2018 | Cheng et al. |
| 9,997,418 | B2 | 6/2018 | Pranatharthiharan et al. |
| 10,177,046 | B2 | 1/2019 | Cheng et al. |
| 10,651,089 | B2 | 5/2020 | Reznicek et al. |
| 2006/0163670 | A1 | 7/2006 | Ellis-Monaghan et al. |
| 2014/0210011 | A1 | 7/2014 | Baraskar et al. |
| 2016/0284712 | A1* | 9/2016 | Liaw ...................... H10B 10/12 |
| 2017/0317080 | A1* | 11/2017 | Cheng ............... H01L 21/26513 |
| 2017/0358689 | A1* | 12/2017 | Anderson ......... H01L 29/78696 |
| 2018/0040702 | A1 | 2/2018 | Chang et al. |
| 2018/0122706 | A1 | 5/2018 | Cheng et al. |
| 2018/0138093 | A1 | 5/2018 | Adusumilli et al. |
| 2018/0277446 | A1* | 9/2018 | Gluschenkov ........................ H01L 21/823814 |
| 2018/0277541 | A1 | 9/2018 | Gluschenkov et al. |
| 2019/0157452 | A1* | 5/2019 | Kim .................... H01L 29/4232 |
| 2019/0318963 | A1* | 10/2019 | Miao .................... H01L 21/311 |
| 2021/0013108 | A1* | 1/2021 | Wu ..................... H01L 29/0847 |

* cited by examiner

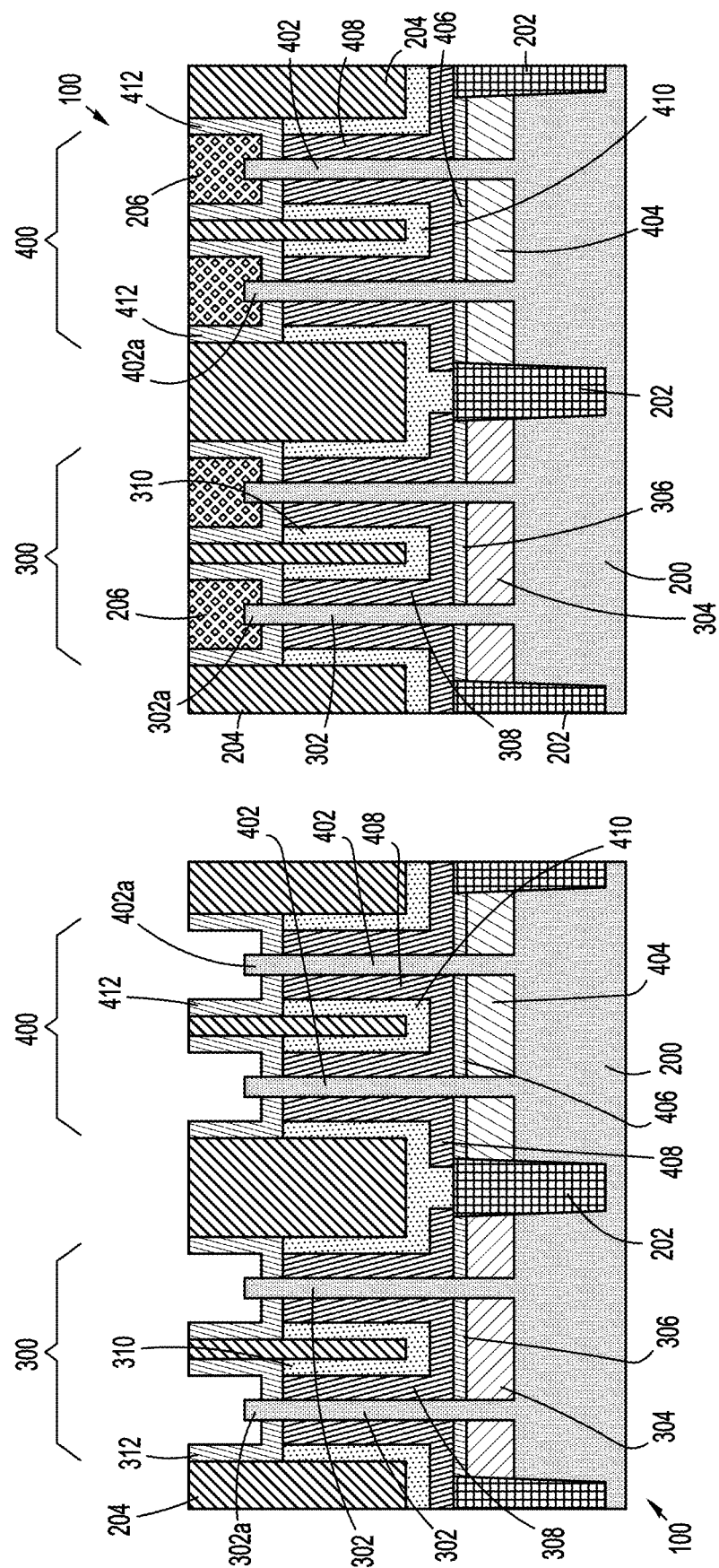

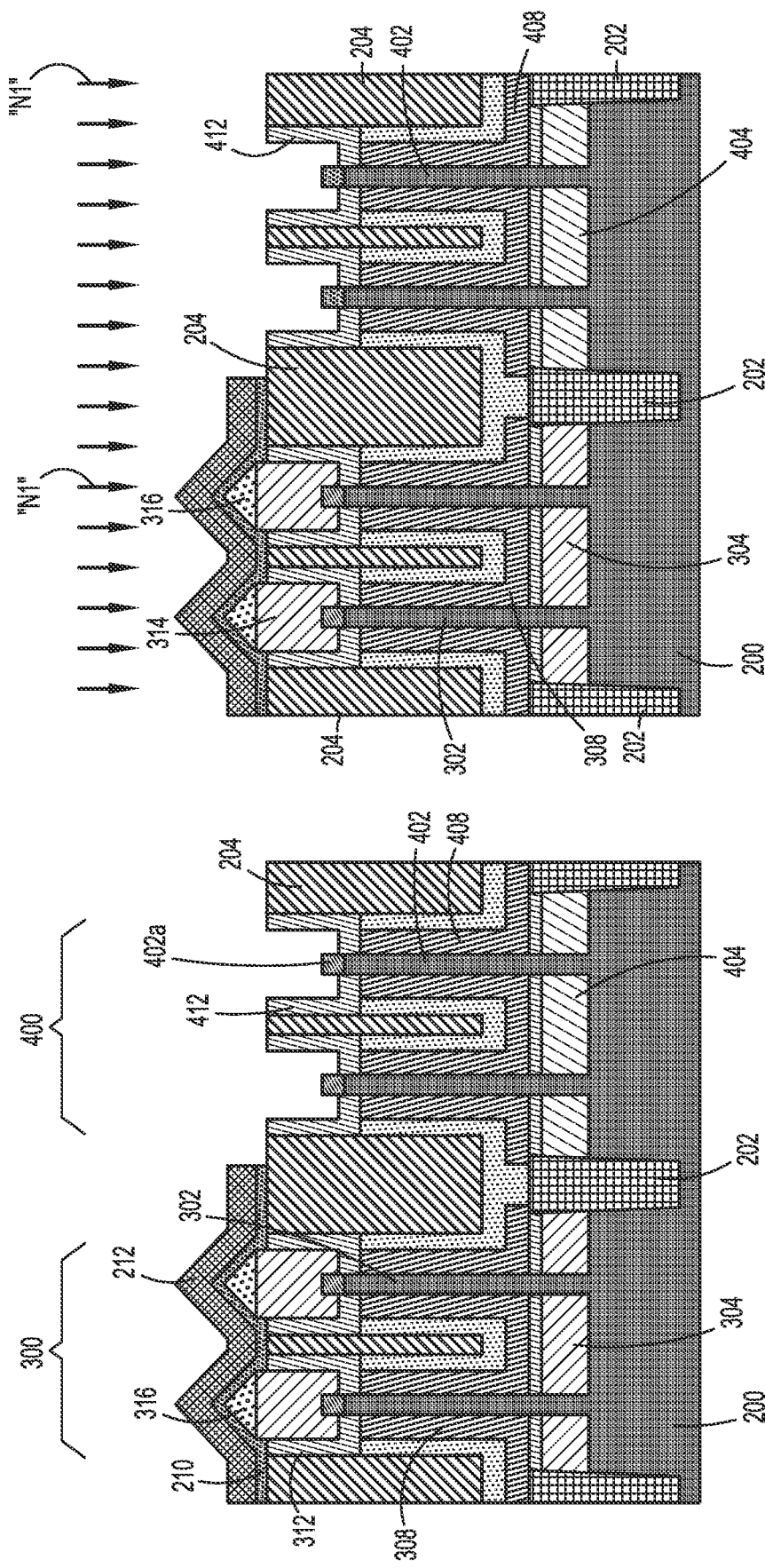

CMOS TOP SOURCE/DRAIN REGION DOPING AND EPITAXIAL GROWTH FOR A VERTICAL FIELD EFFECT TRANSISTOR

BACKGROUND

The present disclosure relates to fabrication methods and resulting structures for semiconductor devices. More specifically, the present disclosure relates to a complementary metal oxide semiconductor (CMOS) vertical field effect transistor (VFET) having highly developed and doped top source/drains.

Vertical field effect transistors (VFET) are semiconductor devices where the source-drain current flows in a direction normal, i.e., vertical, to the substrate surface. In a VFET, a vertical semiconductor pillar defines the channel with the source and drain located at opposing ends of the semiconductor pillar. One advantage of a vertical transistor is that the source/drain and channel regions of a vertical device are stacked vertically in a single footprint, which could be beneficial in area scaling of integrated circuits. Accordingly, VFETs are an attractive option for technology scaling for 5 nm and beyond. Conventional processes for fabricating VFETs require complex multiple lithographic patterning steps to enable appropriate epitaxial growth of the top source/drains. However, due to inconsistencies in the patterning processes, variations of the components of the VFET, including top spacer footprints, are prevalent, which have a deleterious effect on the formation of the top source/drains. Furthermore, conventional processes encounter issues with respect to active doping of the top source/drain surface and associated junction regions.

SUMMARY

In illustrative embodiments, a method comprises forming a p-type field effect transistor region including a p-type bottom source/drain and one or more first vertical fins and an n-type field effect transistor region including an n-type bottom source/drain and one or more second vertical fins onto a semiconductor substrate. The method further comprises forming a top spacer on each of the one or more first vertical fins and the one or more second vertical fins. The method also comprises forming a p-type top source/drain on the one or more first vertical fins of the p-type field effect transistor region. Forming the p-type top source/drain on the one or more first vertical fins includes performing a first step of ion implanting of p-type dopants relative to exposed segments of the one or more first vertical fins, epitaxially growing one or more p-type source/drain layers on the top spacer and on the exposed segments of the one or more first vertical fins and performing a second step of ion implanting of p-type dopants into the one or more p-type source/drain layers. The method also comprises forming an n-type top source/drain on the one or more second vertical fins of the n-type field effect transistor region. Forming the n-type top source/drain on the one or more second vertical fins includes performing a first step of ion implanting of n-type dopants relative to exposed segments of the one or more second vertical fins, epitaxially growing one or more n-type source/drain layers on the top spacer and on the exposed segments of the one or more second vertical fins and performing a second step of ion implanting of n-type dopants into the one or more n-type source/drain layers.

In another illustrative embodiment, a method comprises forming a p-type field effect transistor region including a p-type bottom source/drain and a plurality of first vertical fins and an n-type field effect transistor region including an n-type bottom source/drain and a plurality of second vertical fins onto a semiconductor substrate, forming a top spacer on each of the first vertical fins and the second vertical fins, and forming a p-type top source/drain on each of the first vertical fins. Forming the p-type top source/drain incudes performing a first step of ion implanting of p-type dopants relative to exposed segments of the first vertical fins, epitaxially growing a p-type source/drain layer on the top spacer and on the exposed segments of the first vertical fins, and performing a second step of ion implanting of p-type dopants into the p-type source/drain layer. The method further comprises depositing a sacrificial fill material onto the top spacer of the second vertical fins, exposing the sacrificial fill material to the first and second steps of ion implanting of p-type dopants, removing the sacrificial fill material and forming n-type top source/drains on exposed segments of the second vertical fins.

In yet another illustrative embodiment, a vertical field effect transistor comprises a semiconductor substrate and a p-type field effect transistor structure and an n-type field effect transistor structure each disposed on the semiconductor substrate. The p-type field effect transistor structure includes a p-type bottom source/drain, one or more first vertical fins with one or more metal gates, a p-type top source/drain and implanted p-type dopants. The n-type field effect transistor structure includes an n-type bottom source/drain, one or more second vertical fins with one or more metal gates, an n-type top source/drain and implanted p-type dopants and n-type dopants. A shallow trench isolation region in the semiconductor substrate is disposed between the p-type field effect transistor structure and the n-type field effect transistor structure.

These and other objects, features and advantages of the present disclosure will become apparent from the following detailed description of illustrative embodiments thereof, which is to be read in connection with the accompanying drawings.

BRIEF DESCRIPTION OF THE DRAWINGS

FIG. 1 is a cross-sectional view of a semiconductor structure at a first intermediate stage of fabrication according to one or more illustrative embodiments.

FIG. 2 is a cross-sectional view of the semiconductor structure at a second intermediate stage of fabrication according to one or more illustrative embodiments.

FIG. 11 is a cross-sectional view of a semiconductor structure at an eleventh intermediate stage of fabrication according to one or more illustrative embodiments.

FIG. 12 is a cross-sectional view of a semiconductor structure at a twelfth intermediate stage of fabrication according to one or more illustrative embodiments.

DETAILED DESCRIPTION

Figures 3, 4:
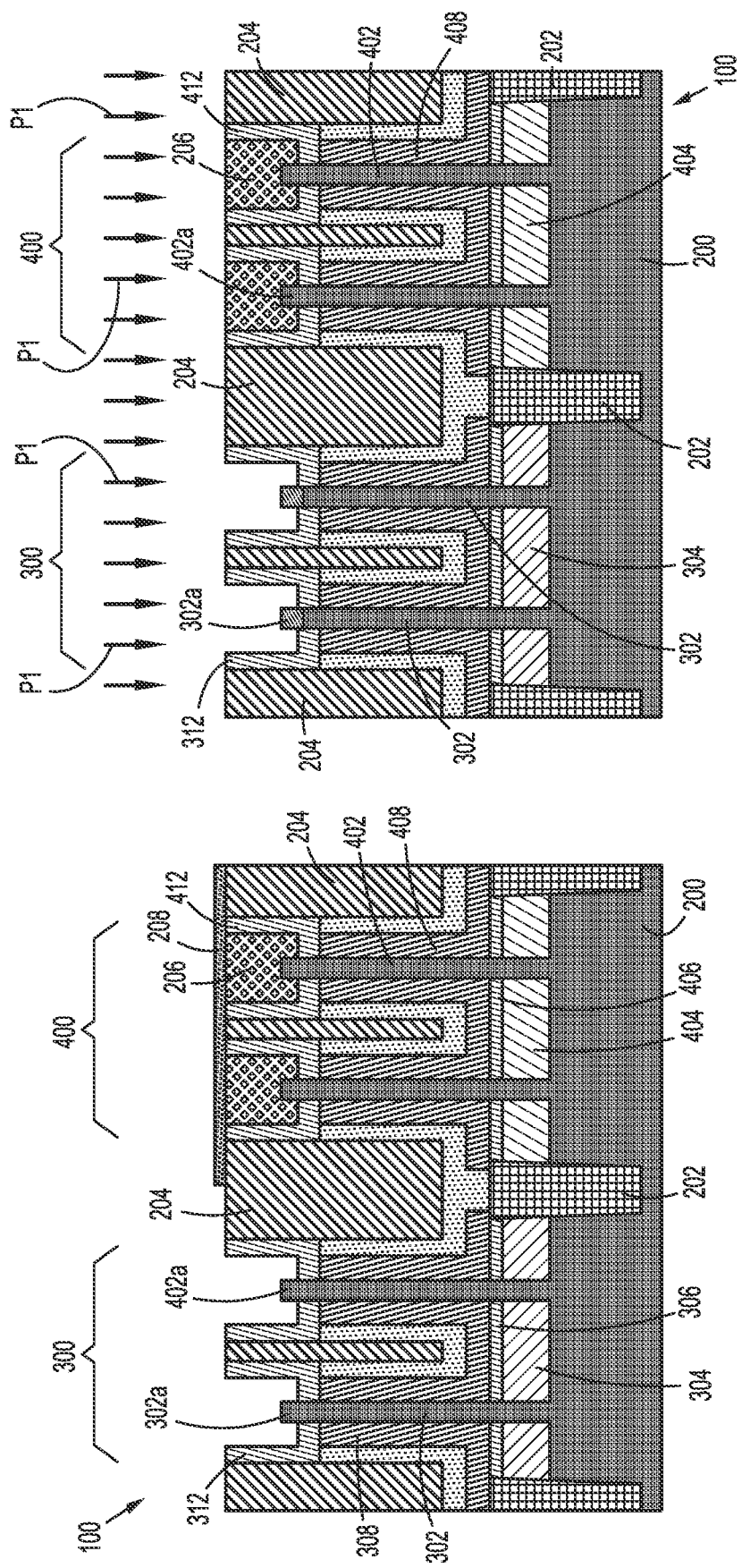
FIG. 3 is a cross-sectional view of the semiconductor structure at a third intermediate stage of fabrication according to one or more illustrative embodiments.
FIG. 4 is a cross-sectional view of the semiconductor structure at a fourth intermediate stage of fabrication according to one or more illustrative embodiments.

Illustrative embodiments of the disclosure will now be described with regard to methods for fabricating semiconductor substrates as well as a semiconductor device comprising one or more CMOS VFETs with highly developed and doped top source/drains. Moreover, semiconductor fabrication methods for VFETs according to illustrative embodiments implement a process flow to fabricate the top source/drains, which enables the formation of VFETs with increased functionality and reduced scaling. One exemplary illustrative methodology creates a VFET device with minimal balanced patterning steps producing uniform top spacers, and enhancing epitaxial growth of the top source/drains.

The various layers, structures, and regions shown in the accompanying drawings are schematic illustrations that are not drawn to scale. In addition, for ease of explanation, one or more layers, structures, and regions of a type commonly used to form semiconductor devices or structures may not be explicitly shown in a given drawing. This does not imply that any layers, structures, and regions not explicitly shown are omitted from the actual semiconductor structures. Furthermore, the embodiments discussed herein are not limited to the particular materials, features, and processing steps shown and described herein. In particular, with respect to semiconductor processing steps, it is to be emphasized that the descriptions provided herein are not intended to encompass all of the processing steps that may be required to form a functional semiconductor integrated circuit device. Rather, certain processing steps that are commonly used in forming semiconductor devices, such as, e.g., wet cleaning and annealing steps, are purposefully not described herein for economy of description.

Moreover, the same or similar reference numbers are used throughout the drawings to denote the same or similar features, elements, or structures, and thus, a detailed explanation of the same or similar features, elements, or structures will not be repeated for each of the drawings. The terms "about" or "substantially" as used herein with regard to thicknesses, widths, percentages, ranges, etc., are meant to denote being close or approximate to, but not exactly. For example, the term "about" or "substantially" as used herein implies that a small margin of error is present. Further, the terms "vertical" or "vertical direction" or "vertical height" as used herein denote a Z-direction of the Cartesian coordinates shown in the drawings, and the terms "horizontal," or "horizontal direction," or "lateral direction" as used herein denote an X-direction and/or Y-direction of the Cartesian coordinates shown in the drawings.

Additionally, the term "illustrative" is used herein to mean "serving as an example, instance or illustration." Any embodiment or design described herein is intended to be "illustrative" and is not necessarily to be construed as preferred or advantageous over other embodiments or designs. The term "connection" can include both an indirect "connection" and a direct "connection." The terms "on" or "onto" with respect to placement of components relative to the semiconductor structure is not to be interpreted as requiring direct contact of the components for it is possible one or more intermediate components, layers or coatings may be positioned between the select components unless otherwise specified. More specifically, positional relationships, unless specified otherwise, can be direct or indirect, and the present disclosure is not intended to be limiting in this respect.

As previously noted herein, for the sake of brevity, conventional techniques related to semiconductor device and integrated circuit (IC) fabrication may or may not be described in detail herein. Although specific fabrication operations used in implementing one or more embodiments of the present disclosure can be individually known, the described combination of operations and/or resulting structures of the present disclosure are unique. Thus, the unique combination of the operations described in connection with the fabrication of a semiconductor structure including a CMOS VFET device according to illustrative embodiments utilize a variety of individually known physical and chemical processes performed on a semiconductor (e.g., silicon) substrate, some of which are described in the immediately following paragraphs.

As previously discussed, VFET devices have been developed to achieve a reduced FET device footprint without compromising FET device performance characteristics. A VFET has a channel perpendicular to the substrate surface as opposed to a conventional FET, which has a channel extending substantially parallel to the substrate surface. Forming the top source/drain contacts of a VFET device may be problematic due to inconsistencies and complexities in the patterning processes. Moreover, reduced VFET footprint requirements have resulted in increases in top source/drain contact resistance thereby requiring additional doping via, for example, ion implantation processes to improve performance. However, the additional ion implantation processes require further patterning adding additional complexity to manufacture of VFET devices. Accordingly, illustrative embodiments of the present disclosure are directed to formation of top spacers and top drain/source contacts fabricated with minimal patterning steps and multiple ion implantation processes, which addresses the aforementioned issues and concerns of current VFET architectures.

In the discussion that follows, the semiconductor structure, which will incorporate one or more VFET devices, will be referred to as the "VFET structure 100" throughout the various stages of fabrication, as represented in all the accompanying drawings.

With initial reference to FIG. 1, there is schematically illustrated, in a cross-sectional view, a VFET structure 100 at an early or first intermediate stage of fabrication. At this stage of fabrication, the VFET structure 100 includes a semiconductor substrate 200 having a pFET region 300 and an nFET region 400 incorporated therein. The semiconductor substrate 200 may be incorporated as a single component or may include multiple components, i.e., one semiconductor substrate including the pFET region 300 and another semiconductor substrate including the nFET region 400. The semiconductor substrate 200 may comprise a bulk semiconductor substrate formed of, e.g., silicon, or other types of semiconductor substrate materials that are commonly used in bulk semiconductor fabrication processes such as germanium, silicon-germanium alloy, silicon carbide, silicon-germanium carbide alloy, or compound semiconductor materials (e.g. III-V and II-VI). Non-limiting examples of compound semiconductor materials include gallium arsenide, indium arsenide, and indium phosphide. In another embodiment, the semiconductor substrate 200 may comprise an active semiconductor layer (e.g., silicon (Si) layer, silicon germanium (SiGe) layer, III-V compound semiconductor layer, etc.) of a SOI (silicon on insulator) substrate, which comprises an insulating layer (e.g., oxide layer) disposed between a base substrate layer (e.g., silicon substrate) and the active semiconductor substrate 200 in which active circuit components (e.g., VFET devices) are formed as part of a front-end-of-line (FEOL) layer. In some embodiments, the upper surface of the semiconductor substrate 200 may be crystalline material, such as a single crystal material. The term "crystalline" includes nanocrystalline, polycrystalline or microcrystalline. The term "single crystalline" denotes a crystalline solid, in which the crystal lattice of the entire sample is substantially continuous and substantially unbroken to the edges of the sample, with substantially no grain boundaries.

The pFET and nFET regions 300, 400 further include pairs of respective semiconductor first vertical fins 302 and second vertical fins 402 depending upwardly from the semiconductor substrate 200. The first and second vertical fins 302, 402 are generally normal to, or perpendicular to, the semiconductor substrate 200. The first and second vertical fins 302, 402 may be formed simultaneously with the semiconductor substrate 200 during the same patterning process, such as, self-aligned double patterning or self-aligned quadruple patterning. The first and second vertical fins 302, 402 may be formed, e.g., by removing material from the semiconductor substrate 200 using a photolithography process followed by an anisotropic etching process such as reactive ion etching (ME) or plasma etching. Other methods of forming the first and second vertical fins 302, 402 known in the art may also be utilized, such as sidewall image transfer (SIT) process.

The first and second vertical fins 302, 402 each can have a width ranging from 5 nanometers (nm) to 40 nanometers (nm), for example, from 10 nm to 20 nm. Adjacent fins 302, 402 within each of the pFET and nFET regions 300, 400 can be separated by a pitch ranging from 20 nm to 100 nm, for example, from 30 nm to 50 nm. The first and second vertical fins 302, 402 can be made of any suitable semiconductor such as, for example, silicon germanium (SiGe) or silicon (Si).

In illustrative embodiments, the first and second vertical fins 302, 402 are patterned using a hard mask (not shown). The hard mask includes any suitable hard mask material, such as, for example, a silicon nitride. The hard mask can be formed utilizing a deposition process such as, for example, chemical vapor deposition (CVD), plasma enhanced chemical vapor deposition (PECVD), chemical solution deposition, or evaporation. The hard mask material is used to cover/protect the first and second vertical fins 302, 402 during prior and subsequent etching processes. In FIG. 1, the hard mask is already etched away leaving exposed upper segments 302a, 402a of the first and second vertical fins 302, 402.

Beneath the pairs of first and second vertical fins 302, 402 are respective p-type and n-type bottom source/drains 304, 404. In illustrative embodiments, the p-type and n-type bottom source/drains 304, 404 may be in-situ doped wherein dopants are incorporated into the p-type and n-type bottom source/drains 304, 404 during epitaxial growth of the bottom p-type and n-type source/drains 304, 404. For example, the p-type bottom source/drain region 304 may comprise a doped epitaxial silicon-germanium (SiGe) layer. Examples of p-type dopants include gallium (Ga), boron (B), aluminum (Al), etc. The n-type bottom source/drain region 404 may comprise a doped epitaxial silicon (Si) material. Examples of n-type dopants include phosphorous (P) and arsenic (As), and optionally antimony (Sb). It is to be understood that the term "source/drain" as used herein means that a given source/drain can be either a source region or a drain region, depending on the application or circuit configuration.

In other illustrative embodiments, the p-type and n-type bottom source/drains 304, 404 may be formed via an ion implantation process(es). In one illustrative embodiment, the p-type bottom source/drain 304 may comprise respective p-type dopants and the n-type bottom source/drain 404 may comprise n-type dopants of the types described hereinabove. The p-type and n-type dopants are introduced during respective ion implantation processes with the use of patterned implant masks (not shown). The implantation processes performed on the p-type and n-type bottom source/drains 304, 404 may occur before or after the formation of the semiconductor vertical fins 302, 402.

Disposed above the bottom source/drains 304, 404 are bottom spacer layers 306, 406. The bottom spacer layers 306, 406 may be made of any insulating material, such as silicon nitride (SiN), silicon oxide (SiO2), silicon oxynitrides (SiOxNy), or a combination thereof, and may have a thickness ranging from 4 nm to approximately 15 nm, or between about 5 nm to about 10 nm. In one illustrative embodiment, the bottom spacer layers 306, 406 comprises silicon nitride (SiN), and may be formed by any method known in the art, including directional deposition and etching processes.

A shallow trench isolation (STI) 202 is disposed between the pFET and nFET regions 300, 400. The STI 202 can be composed of any dielectric, such as an oxide, nitride, and/or oxynitride material. For example, the STI 202 when composed of an oxide can be silicon oxide (SiO2), and the STI 202 when composed of a nitride can be silicon nitride (SiN). In some embodiments, the STI 202 can be formed using photolithography, etch, and deposition processes. The STI 202 extends below the p-type and n-type bottom source/drains 304, 404. In other illustrative embodiments, the STI 202 is formed with multiple insulating materials, e.g., forming a silicon nitride (SiN) liner to line a shallow trench, and depositing a silicon oxide (SiO$_2$) material over the liner to fill the shallow trench.

With continued reference to FIG. 1, the pFET and nFET regions 300, 400 include respective p-type and n-type metal gates 308, 408 formed over channel regions (i.e., the sidewalls) of the respective first and second vertical fins 302, 402. In illustrative embodiments, the p-type and n-type metal gates can be high-k metal gates (HKMG) and can include, for example, one or more high-k gate dielectric films and one or more work function metals (a p-type work function metal and an n-type work function metal). P-type work function metals include compositions such as ruthenium, palladium, platinum, cobalt, nickel, and conductive metal oxides or nitrides, or any combination thereof. N-type work function metals include compositions such as hafnium, zirconium, titanium, tantalum, aluminum, metal carbides (e.g., hafnium carbide, zirconium carbide, titanium carbide, and aluminum carbide), nitrides, aluminides, or any combination thereof. The p-type and n-type work function metals may be deposited by a suitable deposition process including, for example, physical vapor deposition (PVD), chemical vapor deposition (CVD), plasma-enhanced chemical vapor deposition (PECVD), plating, thermal or e-beam evaporation, and sputtering and etched by known etching processes. The p-type and n-type metal gates 308, 408 may further comprise dopants that are incorporated during or after deposition.

The p-type and n-type metal gates 308, 408 are encapsulated within capping layers 310, 410. The capping layers 310, 410 may comprises a silicon nitride (SiN) or other suitable dielectric material. The capping layers 310, 410 may be deposited via any conventional deposition process.

With continued reference to FIG. 1, the pFET and nFET regions 300, 400 include top spacers 312, 412 adjacent the vertical tops of the respective vertical fins 302, 402. The top spacers 312, 412 each may comprise silicon nitride (SiN), silicon oxycarbonitride (SiOCN), or boron-modified silicon carbonitride (SiBCN). The top spacers 312, 412 are each formed using well-known deposition and etching techniques. In one illustrative embodiment, the top spacers 312, 412 are formed by depositing a conformal spacer layer, and performing a reactive ion etching (ME) process to form the generally cylindrical shape of the top spacers 312, 412. As shown, the upper segments 302a, 402a of the first and second vertical fins 302, 402 are within the top spacers 312, 412. In one illustrative embodiment, the upper segments 302a, 402a of the first and second vertical fins 302, 402 may reside within the chambers of the respective top spacers 312, 412. One function of the top spacers 312, 412 is to vertically isolate the p-type and n-type metal gates 308, 408 from the respective top source/drains to be formed in the pFET and nFET regions 300, 400.

With continued reference to FIG. 1, at this first intermediate stage of fabrication, an interlayer dielectric (ILD) 204 is formed over the VFET structure 100. The ILD 204 can be any suitable dielectric material, such as, for example, a silicon oxide ($SiO_2$), and can be formed using any suitable process. In illustrative embodiments, the ILD 204 is planarized to be coplanar with the upper surface of the pFET and nFET regions 300, 400 using, for example, a chemical mechanical polishing (CMP) process. In some embodiments of the invention, the CMP can be utilized to remove excess portions of the ILD 204 selective to the material of the work function metals of the p-type and n-type metal gates 308, 408 and/or materials of the first and second vertical fins 302, 402.

With reference now to FIG. 2, a second intermediate stage of fabrication of the VFET structure 100 is illustrated. A sacrificial fill material 206 such as, amorphous silicon layer (a-Si) or a polycrystalline silicon layer, is deposited into the interior of each of the top spacers 312, 412 of the pFET and nFET regions 300, 400. The sacrificial fill material 206 may be deposited using known dry deposition techniques such as atomic layer deposition (ALD), physical vapor deposition (PVD), chemical vapor deposition (CVD) or wet deposition techniques such as electroplating, and electroless plating, etc. The sacrificial fill material 206 may be subjected to a planarization process, e.g., such as a CMP (chemical-mechanical polish) process utilizing a suitable etch slurry, to be coplanar with the top surface of the top spacers 312, 412.

With reference now to FIG. 3 depicting a third intermediate stage of fabrication, a first liner mask 208 is formed over the top of the VFET structure 100 including the pFET and nFET regions 300, 400. The first liner mask 208 may be any suitable material deposited via conventional deposition processes to conform to the upper surface of the VFET structure 100. In illustrative embodiments, the first liner mask 208 comprises a silicon nitride (SiN). Other materials are also envisioned. Thereafter, via conventional lithographic and etching processes, a segment of the first liner mask 208 is removed to expose the pFET region 300 while maintaining coverage over the nFET region 400 as shown in FIG. 3. Subsequently, through a suitable etching process, the sacrificial fill material 206 within the top spacers 312 of the pFET region 300 is removed. As depicted, the upper segments 302a of the second vertical fins 302 are exposed within the top spacers 312. The remaining portion of the first liner mask 208 over the nFET region 400 may then be removed using conventional removal processes leaving the sacrificial fill material 206 within the top spacers 412 of the nFET region 400.

Referring now to FIG. 4, a fourth intermediate stage of fabrication is depicted. The VFET structure 100 is subjected to an ion implantation process, for example, a first step of ion implantation, to introduce p-type dopants, represented by arrows "P1," into the upper surface of the VFET structure 100. The p-type dopants P1 penetrate the pFET region 300, specifically, the exposed segments 302a of the first vertical fins 302, the surrounding top spacers 312, and surrounding areas area (i.e., the pFET extension region). During this first step of p-type dopant P1 ion implantation, the nFET region 400 is also subjected to this implantation process. However, the presence of the sacrificial fill material 206 within the top spacers 412 absorbs the p-type dopants P1 minimizing potential of the p-type dopants P1 to affect the nFET regions 400. Otherwise stated, no mask or protective liner is needed or required over the nFET region 400 to prevent exposure to the p-type dopants P1 into the vertical fins 402 introduced during the first step of p-type dopant implantation. The sacrificial fill material 206, which is eventually removed, absorbs the p-type dopants P1. However, some of the p-type dopants P1 may penetrate the ILD 204 and the STI 202 within the nFET region 400. Examples of p-type dopants P1 include gallium (Ga), boron (B) and/or aluminum. In one illustrative embodiment, the p-type dopants P1 include gallium (Ga).

Figure 5:
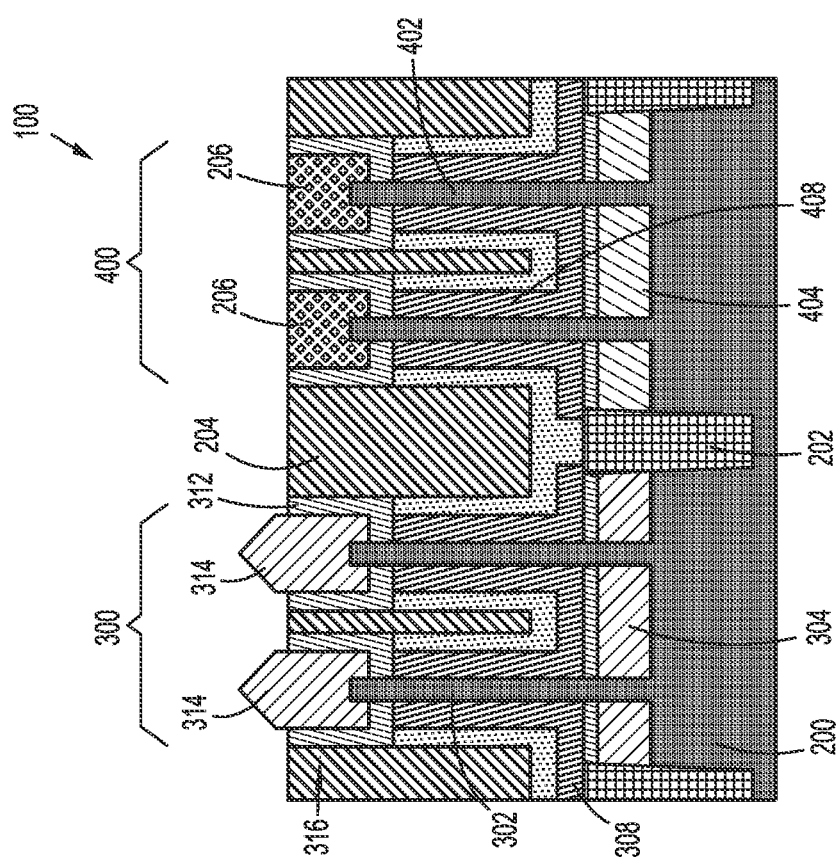
FIG. 5 is a cross-sectional view of the semiconductor structure at a fifth intermediate stage of fabrication according to one or more illustrative embodiments.

Referring now to FIG. 5, a fifth intermediate stage of fabrication of the VFET structure 100 is illustrated. In this stage, p-type source/drain epitaxial layers 314 are epitaxially grown around the exposed segments 302a of the first vertical fins 302 that were infused with p-type dopants P1 during the first step of ion implantation. The material of the p-type top source/drain epitaxial layers 314 may be any suitable p-type semiconductor material including silicon germanium (SiGe). An epitaxial germanium layer can be deposited from a material grown from gaseous or liquid precursors. In some embodiments of the invention, epitaxial regions are epitaxially grown over the substrate. Epitaxial semiconductor materials can be grown using vapor-phase epitaxy (VPE), MBE, liquid-phase epitaxy (LPE), or other suitable processes utilizing a germanium gas source. Such gas sources include germane, digermane, halogermane, dichlorogermane, trichlorogermane, tetrachlorogermane and combinations thereof. The p-type top source/drain epitaxial layers 314 may be epitaxially grown with the same crystalline structure of both the first vertical fins 302.

Figure 6:
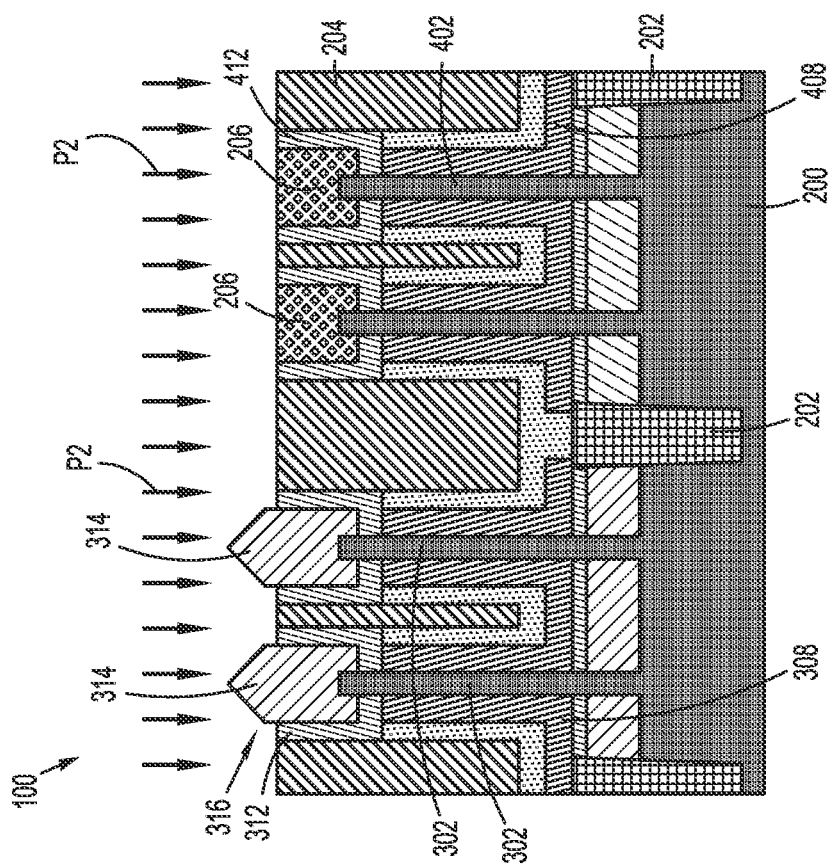
FIG. 6 is a cross-sectional view of the semiconductor structure at a sixth intermediate stage of fabrication according to one or more illustrative embodiments.

Referring now to FIG. 6, illustrating a sixth intermediate stage of fabrication of the VFET structure 100, once the p-type top source/drain epitaxial layers 314 of the pFET region 300 are formed, the VFET structure 100 is subjected to a second ion implantation step or process. More specifically, in a second step of implantation, p-type dopants (depicted by arrows "P2") are directed to the extension region of the VFET structure 100. The p-type dopants P2 penetrate the epitaxial layers 314 and surrounding areas of the unexposed pFET region 300 heavily doping these areas with p-type dopant atoms. This enhances electrical contact with one or more subsequently formed vias within the pFET region 300. Similar to the first step of p-type dopant implantation, the presence of the sacrificial fill material 206 within the top spacers 412 of the NFET region 400 absorbs the p-type dopants P2 thereby removing any need for masking or covering of the nFET region 400. The p-type dopants P2 for the second stage may be the same or different from the p-type dopants P1 utilized in the first stage. In illustrative embodiments, the p-type dopants P2 include boron (B). In addition, similar to the first step of ion implantation, p-type dopants P2 may penetrate the ILD 204 and the STI 202 within the nFET region 400.

Figure 7:
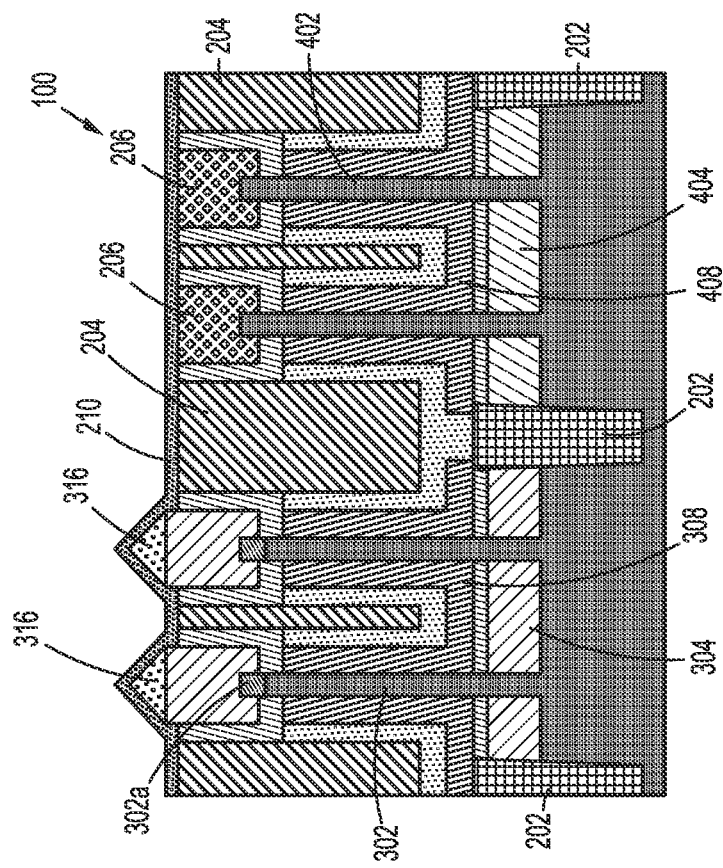
FIG. 7 is a cross-sectional view of the semiconductor structure at a seventh intermediate stage of fabrication according to one or more illustrative embodiments.
Figure 8:
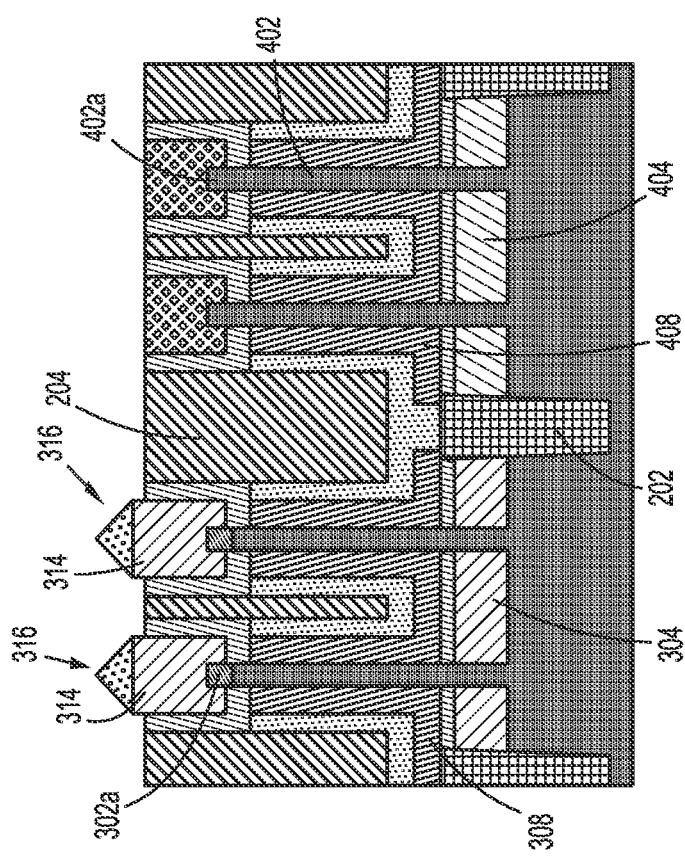
FIG. 8 is a cross-sectional view of the semiconductor structure at an eighth intermediate stage of fabrication according to one or more illustrative embodiments.
Figure 9:
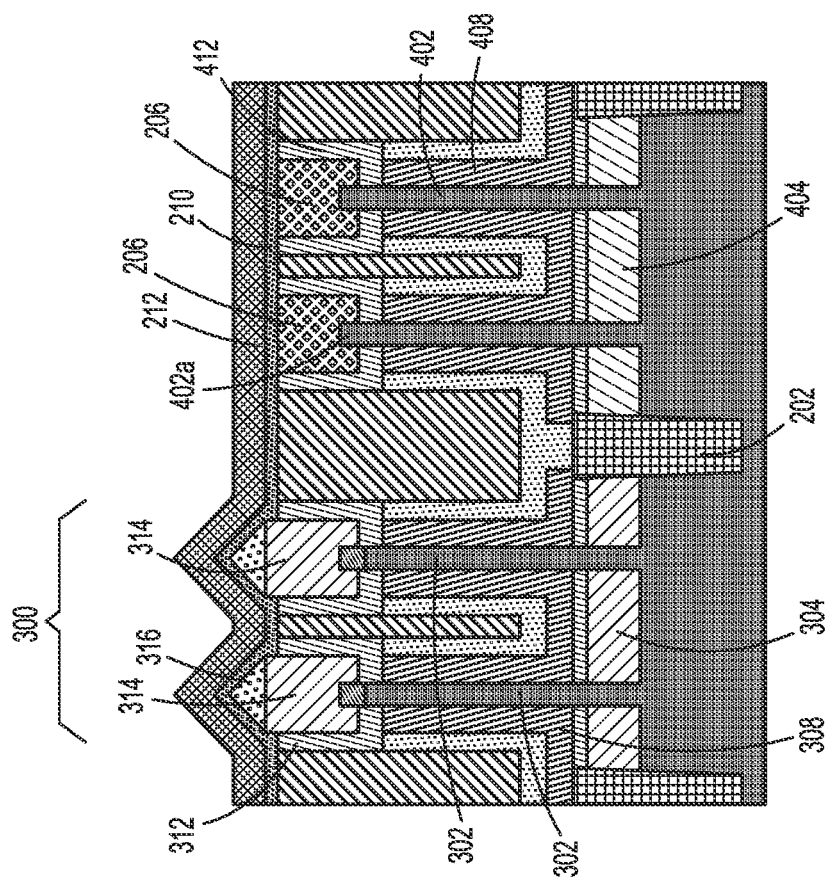
FIG. 9 is a cross-sectional view of the semiconductor structure at a ninth intermediate stage of fabrication according to one or more illustrative embodiments.

Referring now to FIG. 7, a seventh intermediate stage of fabrication of the VFET structure 100 includes subjecting the top p-type source/drain epitaxial layers 314 to an anneal process to activate the implanted ion implants, i.e., the p-type dopants P1, P2 thereby creating p-type top source/drains 316 heavily doped with p-type dopant atoms. Thereafter, as depicted in FIG. 8, a second liner mask 210 is disposed over the VFET structure 100 in accordance with an eighth intermediate stage of fabrication of the VFET structure 100. The second liner mask 210 extends over both the pFET and nFET regions 300, 400. The second liner mask 210 may comprise a silicon nitride (SiN) although other suitable materials are also contemplated. Referring to FIG. 9, following deposition of the second liner mask 210, an additional layer, i.e., a dielectric layer 212, comprising an oxide is deposited on the liner in accordance with a ninth intermediate stage of fabrication. One suitable dielectric layer 212 is fabricated from titanium oxide (TiOx). The dielectric layer 212 may be deposited using any known techniques including, for example, a plasma enhanced atomic layer deposition (PEALD) process, a plasma-enhanced chemical vapor deposition (PECVD) process, a physical vapor deposition (PVD) process, a chemical vapor deposition (CVD) process, an atomic layer deposition (ALD) process, etc. In illustrative embodiments, the dielectric layer 212 is deposited via an atomic layer deposition (ALD) process, which allows for high conformality of the material of the dielectric layer 212 while providing a relatively thick profile.

Figure 10:
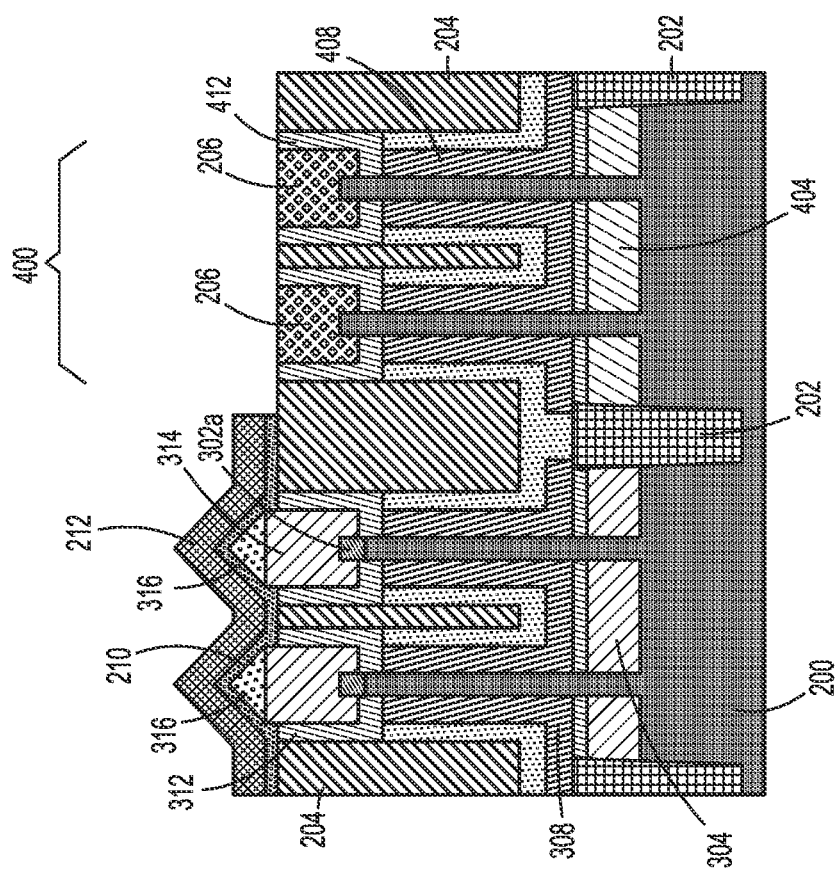
FIG. 10 is a cross-sectional view of the semiconductor structure at a tenth intermediate stage of fabrication according to one or more illustrative embodiments.

With reference to FIG. 10, depicting a tenth intermediate stage of fabrication of the VFET structure 100, using conventional lithographic patterning and one or more removal processes, the dielectric layer 212 and the second liner mask 210 overlying the nFET region 400 are removed. The dielectric layer 212 and the second liner mask 210 over the pFET region 300 are retained to cover and protect the newly formed p-type top source/drains 316. Once the nFET region 400 is exposed, the sacrificial fill material 206 within the top spacers 412 is also pulled or removed via one or more suitable etching processes as depicted in FIG. 11 in accordance with an eleventh stage of fabrication.

FIG. 12 illustrates a twelfth intermediate stage of fabrication of the VFET structure 100. In accordance with this stage, the VFET structure 100 is subjected to a first step of ion implantation to introduce n-type dopants into the nFET region 400. The first step of n-dopant implantation is represented by the arrows "N1." The n-type dopants N1 penetrate the exposed upper segments 402a of the second vertical fins 402 and surrounding areas including the ILD 204 and the STI within the nFET region 400. As used herein, "n-type" refers to the addition of impurities that contribute free electrons to an intrinsic semiconductor. In silicon containing substrate examples of n-type dopants, i.e., impurities, include but are not limited to antimony, arsenic and phosphorous. The n-type dopants N1 may include phosphorous (P) and/or arsenic (AS), and optionally antimony (Sb). In illustrative embodiments, the n-type dopants N1 include phosphorous (P).

During the first step of n-type dopant implantation, the presence of the protective dielectric layer 212 and the second liner mask 210 over the pFET region 300 prevents penetration of the n-type dopants N1 into the p-type top source/drains 316 of the PFET region 300 thereby preserving the integrity of the newly formed p-type top source/drains 316.

Figures 13, 14:
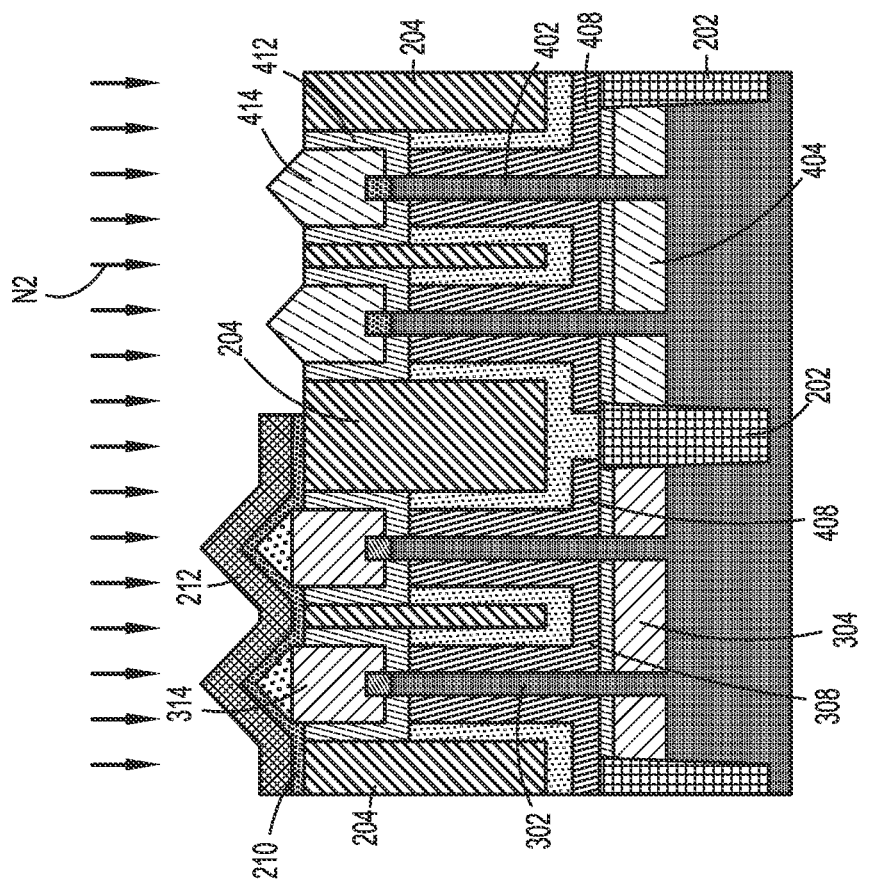
FIG. 13 is a cross-sectional view of a semiconductor structure at a thirteenth intermediate stage of fabrication according to one or more illustrative embodiments.
FIG. 14 is a cross-sectional view of a semiconductor structure at a fourteenth intermediate stage of fabrication according to one or more illustrative embodiments.

With reference now to FIG. 13, a thirteenth stage of fabrication of the VFET structure 100 includes epitaxially growing n-type top source/drain epitaxial layers 414 about the exposed segments 402a of the second vertical fins 402. The n-type source/drain epitaxial layers 414 comprise silicon and are formed via deposition of a silicon gas source on the exposed upper segments 402a of the second vertical fins 402. The silicon gas source may be selected from the group consisting of silane, disilane, trisilane, tetrasilane, hexachlorodisilane, tetrachlorosilane, dichlorosilane, trichlorosilane, methylsilane, dimethylsilane, ethylsilane, methyldisilane, dimethyldisilane, hexamethyldisilane and combinations thereof. The n-type source/drain epitaxial layers 414 may be epitaxially grown with the same crystalline structure of the second vertical fins 402 of the nFET region 400.

Referring now to FIG. 14, a fourteenth stage of fabrication of the VFET structure 100 includes subjecting the VFET structure 100 to a second step of ion implantation of n-type dopants represented by "N2". The additional n-type dopants N2 saturate the n-type top source/drain epitaxial layers 414 within the nFET region 400. The n-type dopants N2 may be the same or different from the n-type dopants N1 used in the first stage of ion implantation of the nFET region 400. In illustrative embodiments, the n-type dopants N1, N2 are different with the n-type dopants N2 including arsenic (As).

As discussed hereinabove, the presence of the protective dielectric bilayer, including the protective dielectric layer 212 and the second liner mask 210, on the pFET region 300 prevents exposure of the newly formed p-type top source/drains 316 to the n-type dopants N1, N2. No additional patterning or masking of the pFET region 300 is required during this second n-type dopant implantation process.

Figure 15:
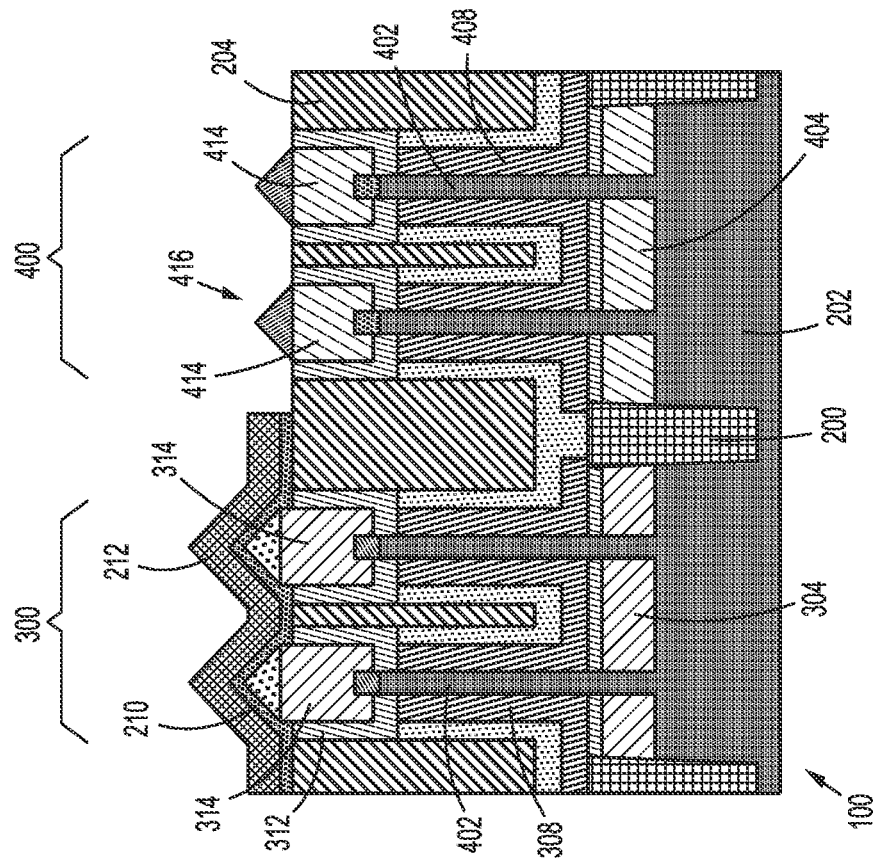
FIG. 15 is a cross-sectional view of a semiconductor structure at a fifteenth intermediate stage of fabrication according to one or more illustrative embodiments.

With reference to FIG. 15, a fifteenth stage of fabrication includes annealing the n-type source/drain epitaxial layers 414 to activate the n-type dopants N1, N2 and form an n-type source/drains 416 on each second vertical fin 402. Following the anneal process, the protective dielectric layer 212 and the second liner mask 210 are removed via one or more etching processes.

Figure 16:
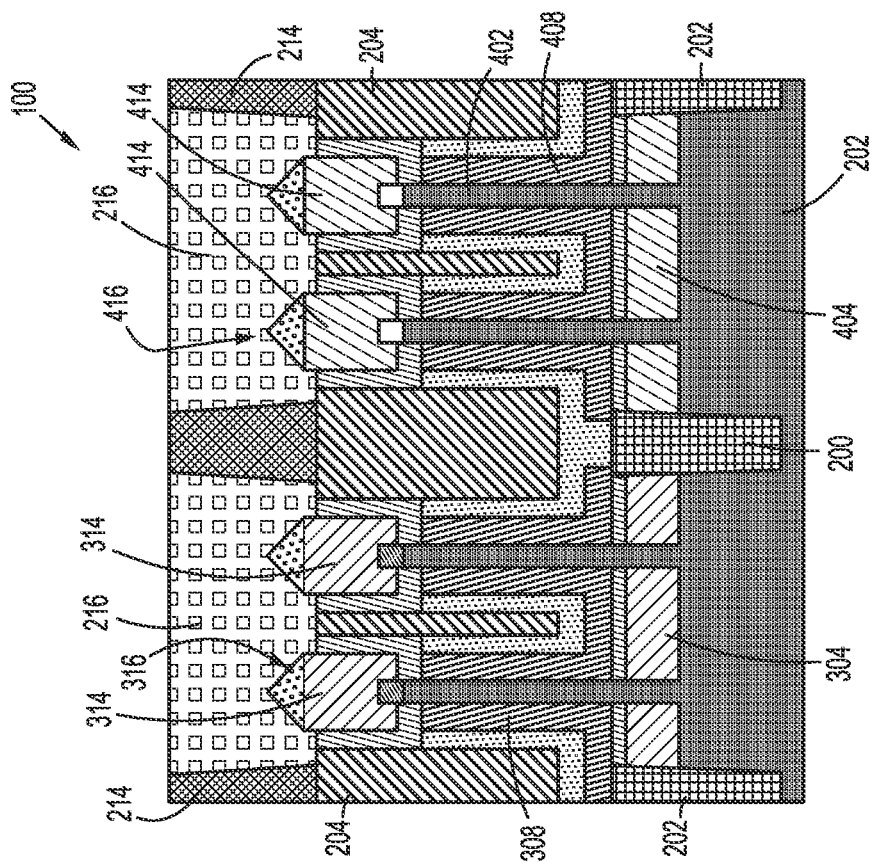
FIG. 16 is a cross-sectional view of a semiconductor structure at a sixteenth intermediate stage of fabrication according to one or more illustrative embodiments.

FIG. 16 illustrates a sixteenth stage of fabrication of the VFET structure 100. Following the formation of the VFET structure 100 shown in FIG. 15, any known sequence of processing steps can be implemented to complete the fabrication of the VFET structure device, the details of which are not needed to understand embodiments of the disclosure. Briefly, by way of example, an interlayer dielectric 214 is deposited on the VFET structure 100. Thereafter, using, e.g., known lithographic and etching processes, trenches and/or via openings are formed in the VFET structure 100 in a known manner. The trenches and/or via openings are filled with conductive material 216 to form the gate contacts in contact with respective pairs of the p-type top source/drains 316 and the n-type top source/drains 416.

The VFET structure 100 creates highly doped surfaces along the pFET and nFET surface regions, i.e., including the p-type top source/drains 316 and the n-type top source/drains 416, and at the pFET and nFET junctions, i.e., about the respective exposed upper segments 302a, 402a of the first and second vertical fins 302, 402. In addition, the nFET region 400 including, for example, at least the ILD 204 and the outer STI 202 within the nFET region 400, may include traces of the p-type dopants P1, P2 (two different p-type dopants, e.g., gallium (G) and Boron (B) introduced in the respective first and second steps of ion implanting of p-type dopants) and may include traces of the n-type dopants "N1," N2" (two different n-type dopants, e.g., phosphorous (P) and arsenic (As) introduced in respective first and second steps of ion implanting of n-type dopants N1, N2). The ILD 204 within the pFET region 300 only includes traces of the p-type dopants P1, P2 (two different p-type dopants, e.g., gallium (G) and boron (B) introduced in respective first and second steps of ion implanting of p-type dopants P1, P2). This is due to the protective presence of the second liner mask 210 and the dielectric layer 212 disposed over the pFET region 300 during the steps of doping with the n-type dopants N1, N2.

Following formation of the gate contacts 216, a BEOL (back end of line) interconnect structure is formed to provide connections to/between the VFET devices and other active or passive devices that are formed as part of the FEOL layer.

It is to be understood that the methods discussed herein for fabricating VFET semiconductor devices with uniform structural profiles can be incorporated within semiconductor processing flows for fabricating other types of semiconductor devices and integrated circuits with various analog and digital circuitry or mixed-signal circuitry. In particular, integrated circuit dies can be fabricated with various devices such as field-effect transistors, bipolar transistors, metal-oxide-semiconductor transistors, diodes, capacitors, inductors, etc. An integrated circuit in accordance with the present disclosure can be employed in applications, hardware, and/or electronic systems. Suitable hardware and systems for implementing the disclosure may include, but are not limited to, personal computers, communication networks, electronic commerce systems, portable communications devices (e.g., cell phones), solid-state media storage devices, functional circuitry, etc. Systems and hardware incorporating such integrated circuits are considered part of the embodiments described herein. Given the teachings of the disclosure provided herein, one of ordinary skill in the art will be able to contemplate other implementations and applications of the techniques of the disclosure.

Although exemplary embodiments have been described herein with reference to the accompanying figures, it is to be understood that the disclosure is not limited to those precise embodiments, and that various other changes and modifications may be made therein by one skilled in the art without departing from the scope of the appended claims.

The invention claimed is:

1. A method, comprising:
   forming a p-type field effect transistor region including a p-type bottom source/drain and one or more first vertical fins and an n-type field effect transistor region including an n-type bottom source/drain and one or more second vertical fins, onto a semiconductor substrate;
   forming a top spacer on each of the one or more first vertical fins and the one or more second vertical fins;
   forming a p-type top source/drain on the one or more first vertical fins of the p-type field effect transistor region by:
      performing a first step of ion implanting of p-type dopants relative to exposed segments of the one or more first vertical fins;
      epitaxially growing one or more p-type source/drain layers on the top spacer and on the exposed segments of the one or more first vertical fins; and
      performing a second step of ion implanting of p-type dopants into the one or more p-type source/drain layers;
   forming an n-type top source/drain on the one or more second vertical fins of the n-type field effect transistor region by:
      performing a first step of ion implanting of n-type dopants relative to exposed segments of the one or more second vertical fins;
      epitaxially growing one or more n-type source/drain layers on the top spacer and on the exposed segments of the one or more second vertical fins; and
      performing a second step of ion implanting of n-type dopants into the one or more n-type source/drain layers; and
   depositing a sacrificial fill material, comprising amorphous silicon, onto the top spacer disposed on the one or more second vertical fins prior to forming the p-type top source/drain, and exposing the sacrificial fill material to at least the first step of ion implanting of p-type dopants.

2. The method of claim 1 further including exposing the sacrificial fill material to the second step of ion implanting of p-type dopants.

3. The method of claim 2 further including removing the sacrificial fill material from the top spacer on the one or more second vertical fins prior to forming the n-type top source/drain on the one or more second vertical fins.

4. The method of claim 3 including forming a dielectric layer on the p-type field effect transistor region to cover the p-type top source/drain on the one or more first vertical fins prior to forming the n-type top source/drain on the one or more second vertical fins.

5. The method of claim 4 wherein depositing the sacrificial fill material includes depositing sacrificial fill material on the top spacer on the one or more first vertical fins.

6. The method of claim 5 including removing the sacrificial fill material from the top spacer of the one or more first vertical fins prior to forming the p-type top source/drain.

7. The method of claim 6 wherein removing the sacrificial fill material from the top spacer of the one or more first vertical fins includes:
   depositing a liner over the p-type field effect transistor region and the n-type field effect transistor region;
   patterning the liner to expose the p-type field effect transistor region; and
   etching the sacrificial fill material from the top spacer on the one or more first vertical fins.

8. The method of claim 4 including forming a liner on the p-type field effect transistor region to cover the p-type top source/drain on the one or more first vertical fins prior to forming dielectric layer, the liner comprising a different material than a material of the dielectric layer.

9. The method of claim 8 wherein forming the liner and forming the dielectric layer includes extending the liner and the dielectric layer to cover the n-type field effect transistor region.

10. The method of claim 9 further including patterning the liner and the dielectric layer to expose the n-type field effect transistor region prior to forming the n-type top source/drain on the one or more second vertical fins.

11. The method of claim 1 wherein the p-type field effect transistor region includes at least two first vertical fins and the n-type field effect transistor region includes at least two second vertical fins.

12. A method, comprising:
forming a p-type field effect transistor region including a p-type bottom source/drain and a plurality of first vertical fins and an n-type field effect transistor region including an n-type bottom source/drain and a plurality of second vertical fins onto a semiconductor substrate;
forming a top spacer on each of the first vertical fins and the second vertical fins;
forming a p-type top source/drain on each of the first vertical fins by:
  performing a first step of ion implanting of p-type dopants relative to exposed segments of the first vertical fins;
  epitaxially growing a p-type source/drain layer on the top spacer on the exposed segments of the first vertical fins; and
  performing a second step of ion implanting of p-type dopants into the p-type source/drain layer;
depositing a sacrificial fill material, comprising amorphous silicon, onto the top spacer of the second vertical fins;
exposing the sacrificial fill material to the first and second steps of ion implanting of p-type dopants;
removing the sacrificial fill material; and
forming n-type top source/drains on exposed segments of the second vertical fins.

13. The method of claim 12 including forming a dielectric layer on the p-type field effect transistor region to cover the p-type top source/drain on each of the first vertical fins prior to forming the n-type top source/drains.

14. The method of claim 13 wherein forming the n-type top source/drains includes:
performing a first step of ion implanting of n-type dopants relative to exposed segments of the second vertical fins;
epitaxially growing an n-type source/drain layer on exposed segments of the second vertical fins; and
performing a second step of ion implanting of n-type dopants into the n-type source/drain layers.

15. The method of claim 14 including forming a metal gate about each of the first vertical fins and the second vertical fins.

16. A method, comprising:
forming a first-type field effect transistor region including a first-type bottom source/drain and a plurality of first vertical fins and a second-type field effect transistor region including a second-type bottom source/drain and a plurality of second vertical fins onto a semiconductor substrate;
depositing a sacrificial fill material, comprising amorphous silicon, onto the first vertical fins and the second vertical fins;
removing the sacrificial fill material from the first vertical fins to expose segments of the first vertical fins;
forming a first-type top source/drain on each of the first vertical fins by:
  performing a first step of ion implanting of first-type dopants into the exposed segments of the first vertical fins;
  epitaxially growing a first-type source/drain layer on each of the exposed segments of the first vertical fins; and
  performing a second step of ion implanting of first-type dopants into the first-type source/drain layers to form the first-type top source/drains;
covering the first-type field effect transistor region including the first-type top source/drain on each of the first vertical fins with a mask layer;
removing the sacrificial fill material from the second vertical fins to expose segments of the second vertical fins; and
forming a second-type top source/drain on each of the second vertical fins.

17. The method of claim 16 wherein forming the second-type top source/drain on each of the second vertical fins includes:
performing a first step of ion implanting of second-type dopants into the exposed segments of the second vertical fins;
epitaxially growing a second-type source/drain layer on each of the exposed segments of the second vertical fins; and
performing a second step of ion implanting of second-type dopants into the second-type source/drain layers to form the second-type top source/drain on each of the second vertical fins.

18. The method of claim 16 including forming a metal gate about each of the first vertical fins and the second vertical fins.

19. The method of claim 16 including forming a dielectric layer on the first-type field effect transistor region to cover the first-type top source/drain on each of the first vertical fins prior to forming the second-type top source/drain on each of the second vertical fins.

20. The method of claim 16, wherein the first-type field effect transistor region includes at least two first vertical fins and the second-type field effect transistor region includes at least two second vertical fins.

* * * * *